United States Patent [19]

Beasom

[11] 3,729,661

[45] Apr. 24, 1973

[54] SEMICONDUCTOR DEVICE

[75] Inventor: James Douglas Beasom, Indian Harbor Beach, Fla.

[73] Assignee: Radiation Incorporated, Melbourne, Fla.

[22] Filed: Feb. 11, 1971

[21] Appl. No.: 114,549

[52] U.S. Cl....317/235 R, 317/235 Y, 317/234 WW, 317/23 WW

[51] Int. Cl...............................................H01l 11/00

[58] Field of Search......................317/235, 40.12, 30

[56] References Cited

UNITED STATES PATENTS

| | | | |
|---|---|---|---|
| 3,197,710 | 7/1965 | Lin | 330/38 |
| 3,445,734 | 5/1969 | Pecoraro et al. | 317/235 |
| 3,427,513 | 2/1969 | Hilbiber | 317/235 |
| 3,454,846 | 7/1969 | Haenichen | 317/235 |

*Primary Examiner*—John W. Huckert
*Assistant Examiner*—E. Wojciechowicz
*Attorney*—Yount & Tarolli

[57] ABSTRACT

An improved semiconductor device of either PNP or NPN type is provided wherein a base layer of a first conductivity type is epitaxially grown so as to overlie a substrate layer. Emitter and collector regions of semiconductor material of a second conductivity type are diffused into the upper surface of the base layer. The substrate layer is doped to be of the second type conductivity and the thickness of the base layer is such that application of a reverse bias voltage across the collector base regions above a predetermined amount will cause a sufficiently wide depletion area to extend about the collector region through the base layer to the substrate layer so that the substrate layer serves as a collector for charge carriers emitted from the emitter region.

6 Claims, 6 Drawing Figures

Patented April 24, 1973 3,729,661

2 Sheets-Sheet 1

INVENTOR
JAMES D. BEASOM
BY Yount and Tarolli
ATTORNEYS

INVENTOR
JAMES D. BEASOM
BY Yount and Tarolli
ATTORNEYS

SEMICONDUCTOR DEVICE

This invention relates to the art of solid state physics devices and, more particularly, to an improved semiconductor structure.

The invention is particularly applicable for use as a digital element or for use in automatic gain control applications wherein gain is a function of voltage; although the invention is not limited thereto, and may be used, for example, in various applications requiring a semiconductor device which exhibits different levels of current gains in dependence upon the magnitude of a control signal.

The primary object of the present invention is to provide an improved semiconductor structure which, depending on the magnitude of a collector-base reverse bias voltage, may serve in one mode as a lateral transistor and in a second mode as a vertical transistor.

A still further object of the present invention is to provide an improved semiconductor structure which has two different levels of current gain dependent upon the magnitude of an applied control signal.

A still further object of the present invention is to provide a transistor constructed to provide a large collector for improved collector efficiency when operated beyond a threshold level.

A still further object of the present invention is to provide an improved semiconductor structure which exhibits characteristics useful as a digital element or for use in automatic gain control applications, wherein gain is a function of voltage.

A still further object of the present invention is to provide an apparatus wherein a conductive contact to a semiconductor region is formed by a depletion layer which extends through an intervening layer of opposite type from a PN junction, and wherein the conductive contact exhibits the characteristic that it exists only for voltages across the PN junction greater than a predetermined value.

In accordance with the present invention a semiconductor device is provided which includes a substrate layer, a base layer of semiconductive material of a first type conductivity overlying the substrate layer, together with first and second spaced regions of material of a second type conductivity located in the upper surface of the base layer, and respectively forming emitter and collector regions. The substrate layer is doped to be of the second type conductivity and the base layer is of a thickness such that application of a reverse bias voltage across the collector-base region above a predetermined amount will cause a sufficiently wide depletion area to extend about the collector region through the base layer to contact the substrate layer, whereby the substrate layer serves as a collector for charge carriers emitted from the emitter region.

In accordance with a more limited aspect of the present invention, the base layer is epitaxially grown on the substrate layer and the first and second regions are diffused into the upper surface of the base layer.

Still further in accordance with a more limited aspect of the invention, the base layer as well as the first and second regions are provided with surfaces for contact with electrodes, and the depletion region existing between the substrate layer and collector region serves as a path for the charge carriers collected by the substrate layer to flow to the collector region.

The foregoing objects and other objects and advantages of the invention will be more readily appreciated from the following description of the preferred embodiment of the invention taken in conjunction with the accompanying drawings which are a part hereof and wherein.

Figure 1:
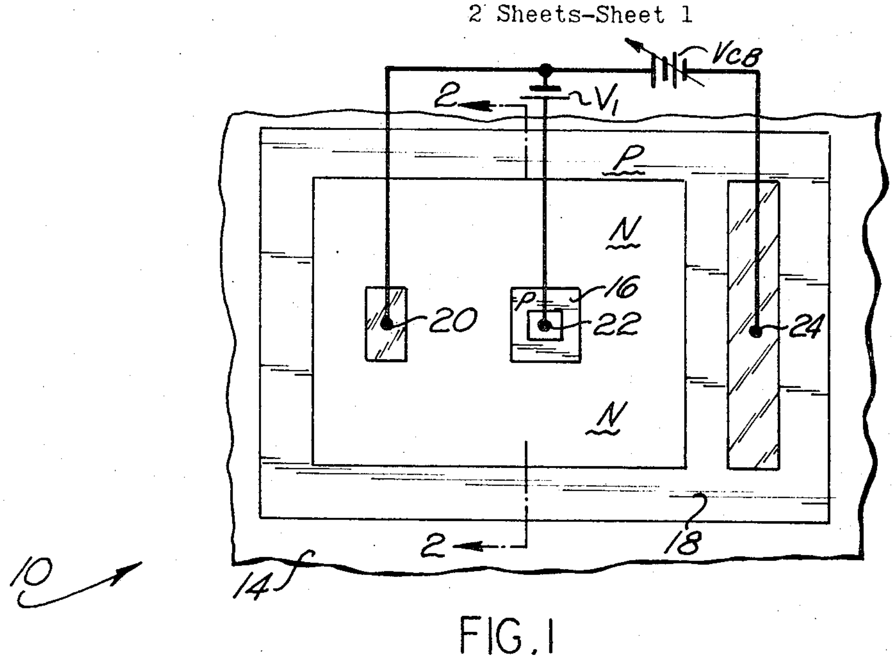
FIG. 1 is a plan view illustrating the topology of a transistor constructed in accordance with the present invention.
Figures 2, 3:
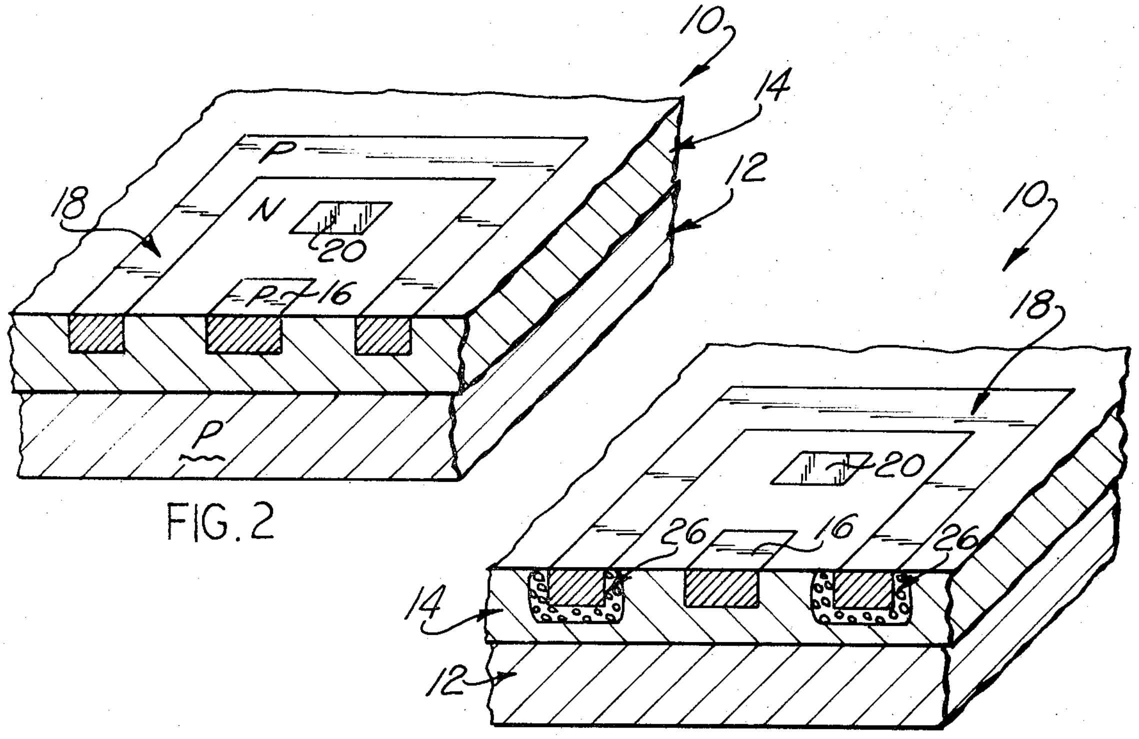
FIG. 2 is a perspective view shown in cross-section and taken generally along line 2–2 looking in the direction of the arrows in FIG. 1.
FIG. 3 is a perspective view similar to that of FIG. 2 illustrating a depletion region which occurs with a reverse bias collector-base voltage.

Referring now to the drawings wherein the showings are for purposes of illustrating the preferred embodiment of the invention only, and not for limiting same, FIGS. 1 and 2 illustrate a PNP transistor 10 constructed in accordance with the present invention. Transistor 10 includes a substrate layer 12 doped so as to be of P-type conductivity and upon which an N-type conductivity base layer 14 has been epitaxially grown. Diffused into the upper surface of base layer 14 are laterally spaced P-type conductivity regions 16 and 18 which respectively serve the functions as emitter and collector. The collector region 18 is laterally spaced outward from and encircles the emitter region 16. The depth of regions 16 and 18 is such that the vertical distance from these regions to the layer 12 is less than the lateral distance between these regions.

The base layer 14, emitter region 16 and collector region 18 have upper exposed surfaces which lie in a common plane, and to which electrical contacts 20, 22 and 24 are suitably secured. Consequently, base layer 14, together with emitter and collector regions 16 and 18 and their respective electrical contacts, serve as a planar, lateral type PNP transistor.

To facilitate the description of operation herein, transistor 10 is shown in FIG. 1 as being connected to a bias voltage source $V_1$, poled as shown, and connected so as to provide the proper bias between base 14 and emitter 16. Also, a variable reverse bias voltage source $V_{CB}$ is connected from collector region 18 to the base layer 14 so as to provide a reverse bias collector-base voltage.

Transistor 10 functions as a quasi-vertical transistor; to wit, depending on the magnitude of the reverse bias collector base voltage $V_{CB}$ the transistor will function as a lateral transistor or a vertical transistor. When transistor 10 functions as a lateral transistor, charge carriers emitted from emitter region 16 are transmitted through base layer 14 and collected by the collector region 18. When transistor 10 functions as a vertical transistor, charge carriers emitted from emitter region 16 are transmitted through base layer 14 and collected by the substrate layer 12. The mode of operation is dependent upon the extent of a depletion region 26 extending from the collector region 18 toward the substrate layer 12. The extent of this region is dependent on the magnitude of the collector-base reverse bias voltage $V_{CB}$.

Reference is now made to FIG. 3 which illustrates a relatively small depletion region 26 extending from the PN junction of base layer 14 and collector region 18 into the base layer 14 toward the substrate 12. The depletion region at this point is the result of a relatively low magnitude of voltage $V_{CB}$. Thus, the depletion region does not extend to and contact the substrate 12, and transistor 10 functions in this low voltage mode as a planar, lateral PNP transistor. The charge carriers emitted from emitter region 16 flow through base layer 14 and are collected by collector region 18. The level of collector current obtained in this low voltage mode is represented, for example, by portion 28 of the characteristic curve of collector current versus the reverse bias voltage $V_{CB}$ in FIG. 6. So long as the magnitude of the collector-base reverse bias voltage $V_{CB}$ is substantially less than that of a predetermined voltage, represented by the voltage level $V_R$, the collector current $I_C$ increases only slightly with increases in the magnitude of the reverse bias voltage $V_{CB}$.

Figures 4, 5:
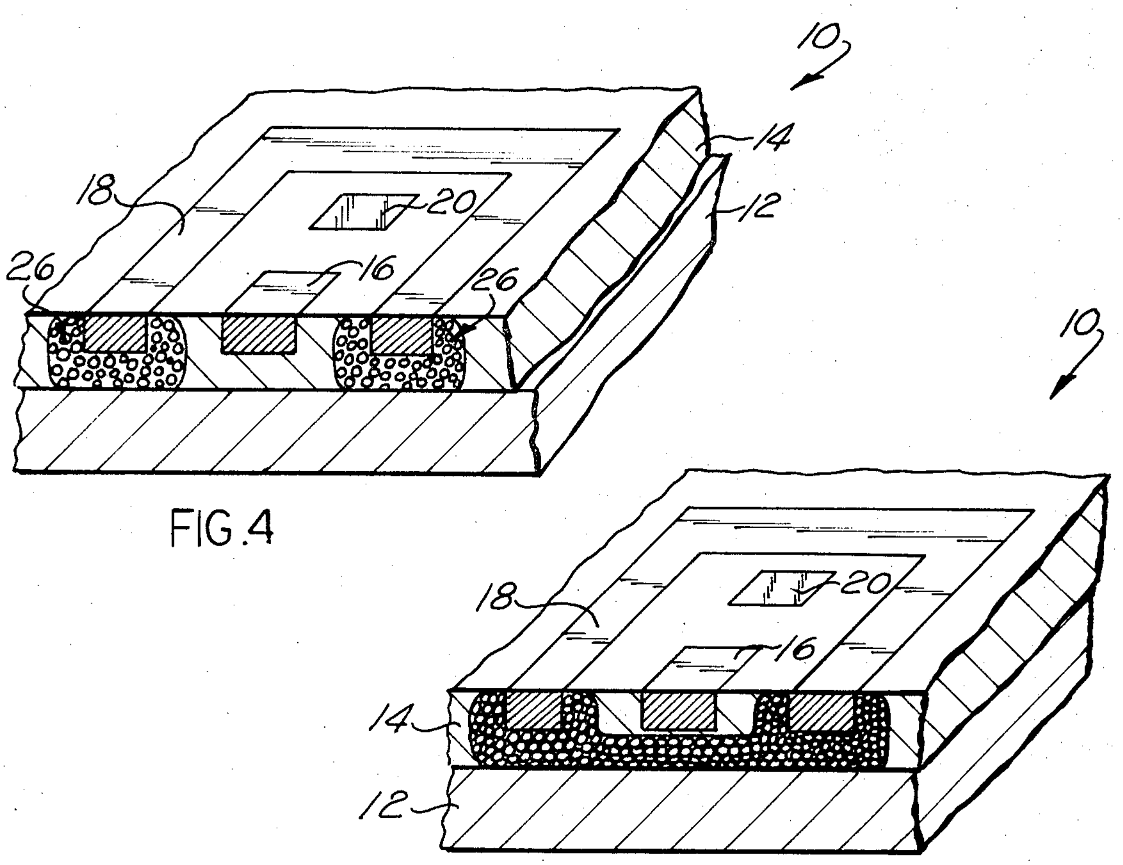
FIG. 4 is a perspective view similar to that of FIG. 3 showing an enlarged depletion region resulting from an increased reverse bias collector-base voltage.
FIG. 5 is a perspective view similar to that of FIGS. 3 and 4 illustrating a still larger depletion region than that shown in either FIGS. 3 or 4; and, FIG. 6 is a graphical illustration showing a curve of collector current in microamperes versus reverse bias collector-base voltage and illustrating the manner in which the transistor structure functions in accordance with the invention.

When the magnitude of reverse bias collector-base voltage $V_{CB}$ is increased so as to be larger than voltage $V_R$, the depletion region 26 grows from that as shown in FIG. 3 through the extent as shown in FIG. 4 to that as shown in FIG. 5, wherein the depletion region extends to and contacts substrate layer 12 and spreads across the PN junction between layers 12 and 14. The dimensions of the material employed is such that the depletion region contacts substrate layer 12 before punch-through can occur between regions 16 and 18. In this high voltage mode the transistor 10 functions as a vertical PNP transistor in that the substrate layer 12 acts as a collector for charge carriers emitted from emitter 16. In this mode any external circuit access to the substrate layer, serving as a collector, is obtained by a current path taken back through the depletion region 26 to the collector region 18. The difference in potential between the substrate layer 12 and the emitter region 16 is relatively independent of the amount of current flow therebetween for values of voltage $V_{CB}$ greater than voltage $V_R$, as is shown by portion 30 of the curve in FIG. 6. Consequently, the voltage existing between substrate layer 12 and emitter region 16 is essentially constant at substantially the level of voltage $V_R$. The substrate layer 12 during this mode assumes a potential $V_S$ equal to the difference between the collector-base reverse bias voltage $V_{CB}$ minus voltage $V_R$. This is the potential of the substrate layer expressed with respect to base layer 14, which is taken as zero potential Since voltage $V_{CB}$ (a negative voltage with respect to emitter region 16) is greater in magnitude than voltage $V_R$, the potential of the substrate layer 12 is negative with respect to that of emitter region 16. Consequently, during this mode the PNP configuration of emitter 16, base 14 and substrate layer 12 serves as a vertical PNP transistor.

For magnitudes of the reverse bias voltage $V_{CB}$ approximately equal to voltage $V_R$, transistor 10 operates in a transition mode having characteristics which partake partially of the low voltage or lateral mode, and the high voltage or vertical mode. As shown in FIG. 4, the depletion region 26 during this transition mode extends entirely through the base layer 14 to the substrate layer 12 and the transistor functions as shown by portion 32 of the curve in FIG. 6.

Figure 6:
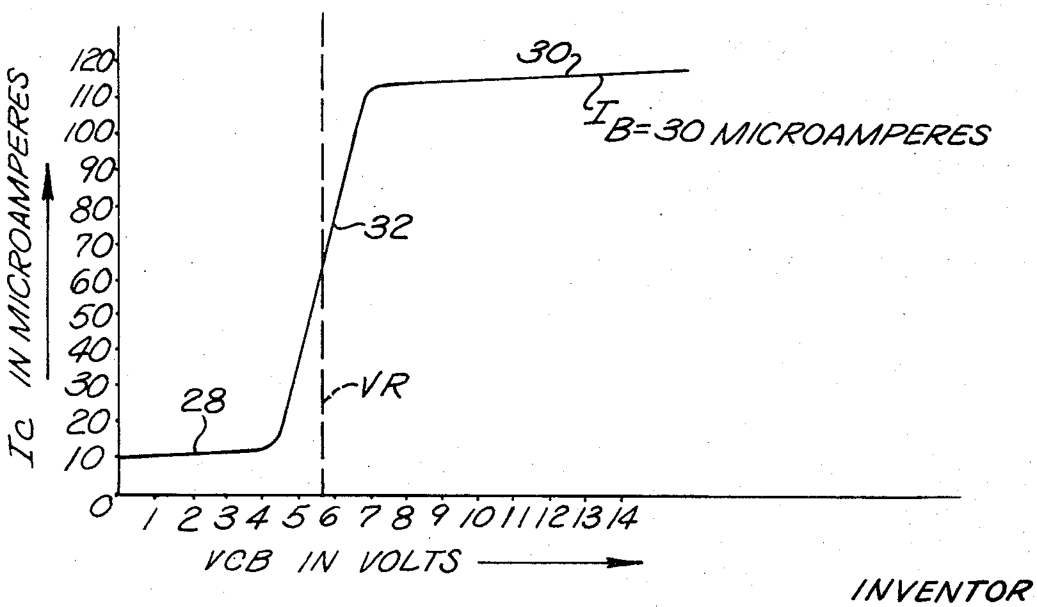

As shown by the curve in FIG. 6, the current gains at the low voltage level 28 and high voltage level 30, respectively representative of the lateral and vertical modes of operation, are in general quite different. These current gains may be independently adjusted by varying the geometry of the structure as well as the material profiles. The level of voltage $V_R$ may also be adjusted independently of the low level gain $B_L$ and the high level gain $B_V$ by adjusting the separation of the emitter region and the substrate layer.

In constructing a structure in accordance with the invention, a PNP type transistor was formed with a substrate having a resistivity of 10 ohm-centimeters of P-type conductivity. A base layer of N-type conductivity was epitaxially grown on the substrate layer with a thickness of 5.5 microns and a resistivity of 2 ohm-centimeters. The emitter and collector regions were formed by diffusion, and were 2.7 microns deep and exhibited a thin film resistance of 200 ohms per square.

More specifically, the fabrication process may be started by using a substrate 12, such as a single crystal silicon P-type boron doped wafer having a resistivity in the range from 8 to 15 ohm cm (10 ohm cm preferred). Typically, numerous similar discrete devices or integrated circuits may be formed in a single wafer. A single crystal N-type epitaxial layer 14 is grown on a major surface of the wafer by the vapor phase reduction of $SiCl_4$ by $H_2$ in the presence of arsine gas ($As_2H_6$) which provides arsenic atoms for the N-type doping of the epi layer. Here, as in the case of the methods utilized in subsequent steps of the process to be described, other methods heretofore employed in the art to achieve the same end may be substituted for the specifically described method. The N-type epitaxial layer is grown to a thickness of approximately 5.5 microns, with a resistivity in the range from 1 to 2 ohm cm (2 ohm cm preferred).

After acid cleaning of the wafer, an oxide layer of about 6,000 angstroms in thickness is grown on the exposed surface of the epi layer. The desired geometry of the areas in which the first and second P regions 16 and 18 are to be formed is delineated and windows are etched in the oxide layer thereat to permit diffusion of an impurity. In particular, boron may be predeposited at the surface of the epi layer exposed in the windows, using $BBr_3$ as the source, and may then be diffused into that layer to achieve P-type doping of about 200 ohms per square to a depth of 2.7 microns (i.e., a junction depth about midway of the thickness of the epi layer). During this portion of the process, a layer of oxide several thousand angstroms in thickness is regrown over the epi layer surface at the window areas.

After the first and second P regions are diffused and the oxide layer regrown, the base contact region is delineated and etched free of oxide. Phosphorus is then deposited through this window as an N-type dopant, using $POCl_3$ as a source, and diffused to provide a heavily doped region to a depth less than that of the first and second P regions (i.e., less than 2.7 microns, say 2 micron), to provide a resistivity of about 2 ohms per square.

Each of the contact apertures for the base region and the first and second P regions is etched clear of oxide and, after acid cleaning, the contact metal is deposited on the exposed surfaces at these apertures, for example, aluminum may be deposited to a thickness of 40 micro inches, as the contact metal, by thermal evaporation.

The separation between the P regions 16 and 18 must be greater than the separation between the P region 18 and the substrate. This relative separation is necessary to insure that the depletion layer, which spreads into the N-type epi layer equally in all directions, will contact the P substrate 12 before it reaches P region 16. If the depletion layer contacts the P region 16, the device will cease to function as a transistor and go into a $BV_{CEo}$ breakdown condition. The vertical current gain of the device increases as the separation between the P regions and the substrate decreases. The lateral current gain of the device increases as the separation between the first and second P regions decreases. The voltage at which the transition from lateral mode to vertical mode of operation occurs decreases in absolute value as the separation between the P regions and the substrate decreases.

As an example, the first and second P regions may be 0.5 mil apart at the point of minimum separation, for the layer thicknesses, doped region depths, and resistivities set forth above.

When the device is functioning in the vertical mode all of the P regions, including the substrate, come into play. Specifically, the P region 16 acts as the emitter, the substrate 12 acts as the collector, and the P region 18 acts as the collector contact. The carriers collected by the substrate flow through the high field depletion layer which extends from P region 18 to the substrate. The collector current flows from the P region 18 to the aluminum contact and out of the device.

Although the transistor described herein has been with reference to a PNP type, it is to b appreciated that an NPN type transistor may also be constructed in accordance with the invention. In such case, P-type material is substituted for the N-type material described herein, and N-type material is substituted for the P-type material described herein. The substrate layer would, of course, be doped to have N-type conductivity and the bias voltage sources would be of opposite polarity.

The invention has been described with reference to a preferred embodiment, however, it is to be appreciated that the invention is not limited to same as various modifications may be made without departing from the spirit and scope of the invention as defined in the appended claims.

Having thus described my invention, I claim:

1. A semiconductor device having both lateral and vertical modes of operation comprising a substrate layer, a base layer of semiconductor material of a first type conductivity overlying said substrate layer, first and second spaced regions of material of a second type conductivity located in the upper surface of said base layer and respectively forming emitter and collector regions so that a lateral semiconductor is defined, said substrate layer being of said second type conductivity, circuit means including electrical contact means secured to said regions and means for applying a variable reverse bias collector-base voltage between said collector and base regions for causing a depletion area to extend from said collector region through said base layer toward both said emitter region and said substrate layer with the extent of said depletion area being dependent on the magnitude of said collector-base voltage, said base layer exhibiting a thickness as measured from said collector region to said substrate layer which is less than the planar distance between said emitter and collector regions whereby so long as said variable reverse bias voltage is below a predetermined magnitude said depletion area will not contact said substrate layer and said device operates in a lateral mode and when said variable reverse bias voltage attains said predetermined magnitude said depletion area contacts said substrate layer and said device operates in a vertical mode with said substrate layer serving as a collector region.

2. A semiconductor device as set forth in claim 1 wherein said first and second regions are diffused into the upper surface of said base layer.

3. A semiconductor device as set forth in claim 1 wherein said base layer is epitaxially grown on said substrate layer.

4. A semiconductor device as set forth in claim 1 wherein said first and second regions and said base layer have respective surfaces located in a single plane for contact with electrodes to define a planar, lateral transistor construction.

5. A semiconductor device as set forth in claim 1 wherein said semiconductive material is of P-type or N-type and the PN junction area of said first region with said base layer is substantially less than that of said second region with said base layer and which is, in turn, substantially less than that of said base layer with said substrate layer.

6. A semiconductor device as set forth in claim 1 wherein said base layer and said first and second regions are provided with surfaces for contact with electrodes and wherein the said depletion region between said substrate layer and collector region serves as a path for flow of charge carriers collected by said substrate layer to said collection region.

* * * * *